United States Patent
Mazure et al.

(10) Patent No.: US 7,799,651 B2
(45) Date of Patent: Sep. 21, 2010

(54) METHOD OF TREATING INTERFACE DEFECTS IN A SUBSTRATE

(75) Inventors: Carlos Mazure, Bernin (FR); Ian Cayrefourcq, St. Nazaire les Eymes (FR); Konstantin Bourdelle, Crolles (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 192 days.

(21) Appl. No.: 12/165,365

(22) Filed: Jun. 30, 2008

(65) Prior Publication Data

US 2009/0014720 A1    Jan. 15, 2009

(30) Foreign Application Priority Data

Jul. 10, 2007    (FR) .................................. 07 56370

(51) Int. Cl.
   *H01L 21/331*    (2006.01)
(52) U.S. Cl. .................. 438/311; 438/406; 438/513; 257/E21.32; 257/E21.102; 257/E21.115; 257/E21.121; 257/E21.311; 257/E21.321
(58) Field of Classification Search .......... 438/311, 438/509, 513, 406, 479, 752, 753, 931, 938; 257/E21.102, 115, 121, 32, 311, 321
   See application file for complete search history.

(56) References Cited

U.S. PATENT DOCUMENTS 4,177,084 A * 12/1979 Lau et al. ................ 117/8
4,602,965 A * 7/1986 McNally .................. 438/520
4,659,392 A * 4/1987 Vasudev .................. 438/412
4,713,354 A * 12/1987 Egawa et al. ............. 438/522
4,863,877 A * 9/1989 Fan et al. ................. 438/492
2004/0009626 A1  1/2004 Tweet et al. .............. 438/93
2006/0154442 A1  7/2006 De Souza et al. .......... 438/455

FOREIGN PATENT DOCUMENTS

WO    WO 2006/130360 A2    12/2006

OTHER PUBLICATIONS

K. K. Bourdelle et al., Fabrication of Directly Bonded Si Substrates with Hybrid Crystal Orientation for Advanced Bulk CMOS Technology, ECS Transactions, vol. 3 (4), pp. 409-415 (2006).
K. L. Saenger et al., "Amorphization/Templated Recrystallization Method For Changing The Orientation Of Single-Crystal Silicon: An Alternative Approach To Hybrid Orientation Substrates" Appl. Phys. Lett., vol. 87, pp. 221911 (2005).

* cited by examiner

*Primary Examiner*—David Nhu
(74) *Attorney, Agent, or Firm*—Winston & Strawn LLP

(57) ABSTRACT

The present invention relates to a method of treating a structure produced from semiconductor materials, wherein the structure includes a first and second substrates defining a common interface that has defects. The method includes forming a layer, called the disorganized layer, which includes the interface, in which at least a part of the crystal lattice is disorganized; and reorganizing the crystal lattice of the disorganized layer in order to force the defects back deeper into the first substrate.

18 Claims, 5 Drawing Sheets

METHOD OF TREATING INTERFACE DEFECTS IN A SUBSTRATE

FIELD OF THE INVENTION

The present invention relates to a method of treating a semiconductor structure comprising a first substrate and a second substrate, the substrates defining a common interface including defects.

The invention is aimed more precisely at substrates produced by direct bonding, for example DSB (Direct Silicon Bonding), which are obtained by creating contact between layers that are identical in nature but different in crystal orientation, or between layers that are different in nature.

BACKGROUND OF THE INVENTION

Direct bonding allows substrates to be obtained in which the active layer and the receptor substrate are directly bonded to each other without an interlayer, without a bonding layer such as an insulating layer for example. For example, a direct bonding between an active layer and a substrate having different crystal orientations, or more generally different crystallographic characteristics, can thus be envisioned.

However different crystalline characteristics may give rise to crystal defects at the interface between the active layer and the receptor substrate, such as dislocations likely to spread into one or the other of the layers. Moreover, the surface treatments designed to improve hydrophilic or hydrophobic bonding behavior produce a modification of the interface with, for example, the formation of oxygen precipitates. Indeed, during hydrophilic bonding a very thin oxide film (of the order of several atomic layers, that is of a thickness of 5 to 10 angströms) is formed on the surface of the substrates.

In the case of hydrophobic bonding this film does not exist, but the substrate itself, ever since its manufacture from ingots, contains oxygen atoms within its lattice. The various treatments the wafers undergo before being brought into contact will lead to the formation of precipitates, clusters formed by rearrangement, agglomeration of these various oxygen atoms. These defects are typically small discontinuous polygonal or spherical structures of a size of the order of several nanometers in diameter. Such defects impair bonding behavior and consequently the quality and the performance of components that will subsequently be fabricated on the substrate.

The article by Bourdelle et al. ("Fabrication of Directly Bonded Si Substrates with Hybrid Crystal Orientation for Advanced Bulk CMOS Technology", ECS Transactions, 3 (4) 409-415 (2006)) thus proposes a method for fabricating DSB substrate according to SMARTCUT® layer transfer technology via hydrophilic bonding between a donor substrate made of silicon in (110) crystal orientation and a receptor substrate made of (100) silicon. A thin layer of sacrificial oxide is deposited on the donor substrate before the following implantation step of bringing the two substrates into intimate contact. After steps for adequate finishing, a heat treatment is carried out in order to dissolve the residual oxide and to form a conductive bonding interface. The layer of sacrificial oxide serves as a shield to protect the surface of the donor substrate from contamination by particles or by metals, which allows an interface without defects and a thin layer from the donor substrate having a very high crystallographic quality to be obtained.

Furthermore, methods are known of fabricating hybrid substrates, that is substrates with an active layer having regions of different crystal orientation, using the amorphization technique. In this respect, the article by Saenger et al. ("Amorphization/templated recrystallization method for changing the orientation of single-crystal silicon: An alternative approach to hybrid orientation substrates", App. Phys. Lett., 87, 221911, 2005) may be referred to, which describes, for a substrate produced with an active layer of silicon in a first orientation bonded onto a support substrate also made of silicon but having a second orientation, the amorphization of certain areas of the active layer, then their recrystallization according to the crystal orientation of the support substrate. However, this method consists in amorphizing the active layer across its whole thickness, through to a depth situated beyond the interface. In addition, this method leads to a recrystallization of the active layer according to the crystal orientation of the support substrate, so that in the areas having undergone this treatment the interface can no longer be distinguished.

One of the aims of the invention is therefore to propose a method for treating a DSB substrate formed by bonding an active layer from a donor substrate onto a receptor substrate, improving the interface quality or shifting the defects present at the interface inside the structure, while conserving the crystalline characteristics of the active layer and of the receptor substrate.

SUMMARY OF THE INVENTION

Thus, the invention relates to a method of treating a structure produced from semiconductor materials, wherein the structure comprises first and second substrates defining a common interface that includes crystal defects adjacent thereto. This method comprises forming a disorganized layer that includes the interface and has a crystal lattice at least a part of which is disorganized; and reorganizing the crystal lattice of the disorganized layer in order to force the defects back into the substrate adjacent thereto.

The disorganized layer is generally obtained by implanting atomic species through the second substrate to at least the depth of the interface while the reorganization is typically achieved by applying a heat treatment, and in particular a recrystallization a heat treatment carried out at a temperature of between 500° C. and 1000° C. for 20 minutes to 2 hours.

Another aspect of the invention relates to a method of obtaining increased bonding in a semiconductor structure that is fabricated by bonding first and second substrates together at a common interface. This method comprises, after bonding, conducting a treatment disclosed herein in order to force crystal defects adjacent the interface back into the substrate adjacent thereto to thus increase bonding between the substrates.

Yet another aspect of the invention relates to A semiconductor material structure comprising first and second substrates defining a common interface, a disorganized layer including at least a part of the interface and having a crystal lattice, at least a part of which is disorganized.

BRIEF DESCRIPTION OF THE DRAWINGS

Other advantages and features of the invention will emerge more clearly from the detailed description to follow of several variant embodiments, given by way of nonlimiting examples, of the treatment method according to the invention, with reference to the appended figures in which.

DETAILED DESCRIPTION OF THE PREFERRED EMBODIMENTS

Figure 1A:
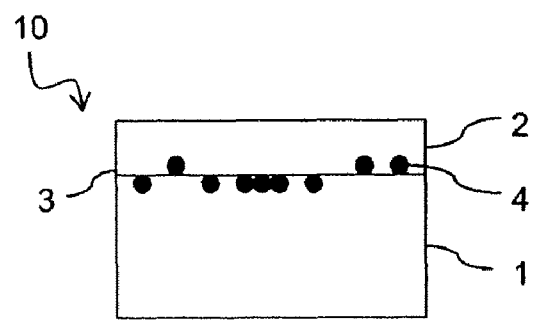
FIGS. 1A to 1D show the main steps of the treatment method according to the invention.

A first subject of the invention relates to a method of treating a structure produced from semiconductor materials, comprising a first substrate and a second substrate, the substrates defining a common interface including defects, the method being characterized in that it comprises at least the steps of:

forming a layer, called the disorganized layer, including the interface, in which at least a part of the crystal lattice is disorganized; and reorganization of the crystal lattice of the disorganized layer, in order to force the defects back deeper into the first substrate.

According to other advantageous features of the method according to the invention, taken separately or in combination:

formation of the disorganized layer is obtained by implanting species through the second substrate to at least the depth of the interface;

the species are chosen from germanium, argon and xenon;

the implantation is carried out with a dose of between $1 \times 10^{14}$ and $5 \times 10^{15}$ atoms/cm$^2$ and an energy of between 30 and 120 keV;

the reorganization of the disorganized layer is obtained by applying a heat treatment;

the heat treatment is carried out at a temperature between 500 and 1000° C., for 20 minutes to 2 hours;

the first substrate and the second substrate are identical or different in nature;

the first substrate and the second substrate have different crystal orientations; the first substrate is made of (100) Si or of SiC; the second substrate is made of (110) Si;

the disorganized layer is amorphous;

the formation of the amorphous layer is carried out by implantation with a dose of between $2 \times 10^{14}$ and $5 \times 10^{15}$ atoms/cm$^2$ and an energy of between 30 and 120 keV in such a way as to shift the crystal defects of the interface deeper into the first substrate;

the formation of the amorphous layer includes at least one additional implantation step so as to shift the defects deeper;

the reorganization is a recrystallization;

the recrystallization is carried out by a heat treatment at a temperature of between 500° and 1000° C. for 20 minutes to 2 hours;

the substrates are connected by hydrophilic or hydrophobic direct bonding;

the defects are forced back from 1000 to 3000 Å deeper into the first substrate;

the disorganized layer is discontinuous; and the implantation is effected through a mask.

Another subject of the invention relates to a method of fabricating a structure by bonding a first substrate and a second substrate, the substrates defining a common interface, the method being characterized in that, after bonding, a treatment as previously described is applied.

According to a particular embodiment, this method comprises, before bonding, the formation of an insulating layer on the surface of the first or of the second substrate.

Particularly advantageously, this method comprises, after bonding and before the treatment, selective dissolution of the insulating layer so as to form a discontinuous insulating layer, and the treatment is applied so as to form disorganized regions in the regions where the insulating layer has been dissolved, such that the defects resulting from the dissolution are forced back deeper into the first substrate.

It is advantageous to use the same mask for selectively dissolving the insulating layer and for forming the discontinuous disorganized layer.

Another subject of the invention relates to a structure produced on the basis of semiconductor materials and comprising a first substrate and a second substrate defining a common interface, the structure being characterized in that it comprises a layer termed "disorganized" including at least a part of the interface, within which at least a part of the crystal lattice is disorganized.

According to a variant of the structure, the disorganized layer is amorphous.

The general principle of the invention is, in a first step, to disorganize the interface by creating within it a layer of which at least one part of the crystal lattice is disorganized, then in a second step to reorganize the crystal lattice of the disorganized layer.

Disorganization of at least a part of the crystal lattice is understood to mean disturbing the sequencing of atoms in the so-called disorganized layer in such a way that, while preserving crystal lattices, the arrangement of atoms in certain areas has a certain irregularity. This disorganization translates into the loss of periodicity in the elementary lattice of the crystal lattice leading, in the extreme case, to amorphization, that is the loss of crystal character. In general one speaks of "disorder" in the lattice parameter: thus to characterize a change in lattice parameters one speaks of a lattice mismatch ($\sigma$). For example, X-ray analyses allow the environment of an atom in a crystal structure to be defined via absorption spectra.

In the invention, the disorganization may therefore comprise various degrees capable of ranging to complete amorphization, that is the complete loss of crystal character.

In this latter case, the reorganization of the amorphous layer is called "recrystallization".

With reference to FIG. 1A, the invention is applied to a structure 10 comprising a first substrate 1 and a second substrate 2 having different crystal orientations and defining a common interface 3. At the interface 3, defects 4 are found, which may be dislocations, oxygen precipitates or any other crystal defect.

According to a particular embodiment, the second substrate 2 may be a thin layer transferred from a donor substrate onto the first substrate 1 for example by a layer transfer of the SMARTCUT® type.

Figure 1B:
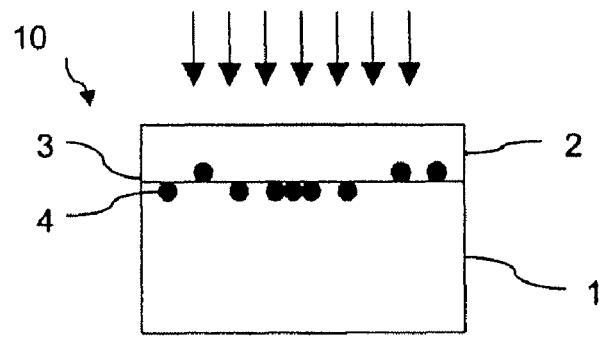
Figure 1C:
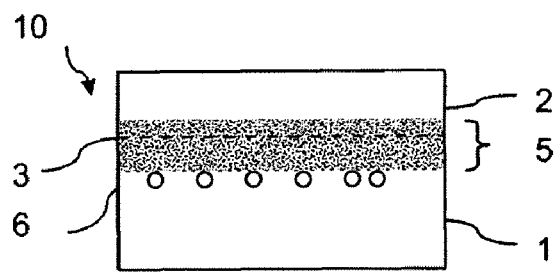
Figure 1D:
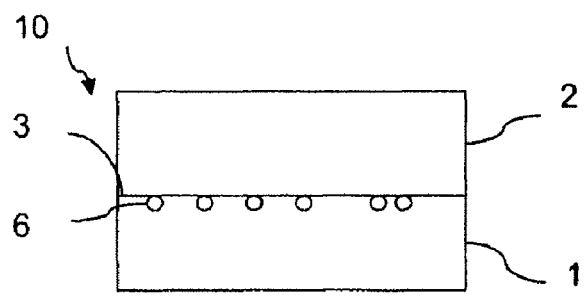

As has been seen, the invention proposes a treatment method that principally comprises two steps. With reference to FIGS. 1B and 1C, a first step comprises the disorganization (or even amorphization) of a layer 5 including the interface 3. With reference to FIG. 1D, this step is followed by a step of reorganizing (if need be, recrystallizing) the disorganized layer 5.

Particularly advantageously, the disorganization—or amorphization—is obtained by implanting heavy species, such as germanium, xenon or argon, deep into the interface. This implantation is schematically represented by the arrows on FIG. 1B. The implantation parameters, namely the dose and the energy, are adapted depending on the depth to be attained, on the thickness of the layer intended to be disorganized and on the degree of disorganization intended to be attained. In all cases, the energy range is between 20 and 200 keV and the implanted doses are of the order of $10^{14}$ to $10^{16}$ atoms/cm². Generally speaking, the implantation allows the atoms within the crystal to be mixed, and also the $SiO_2$ bonds of the oxygen precipitates to be broken. The implanted atoms take up positions on both sides of the bonding interface 3 such that the defects 4 present at the interface find themselves forced back deeper into the receptor substrate after recrystallization.

The reorganization—or recrystallization—is then carried out by means of a heat treatment, the temperature and the duration of which are adapted depending on the state of the disorganized layer. In the case of recrystallization, the thin layer and the receptor substrate serve to seed the recrystallization. With reference to FIG. 1D, at the end of the heat treatment a structure 10 is obtained, the interface 3 of which is free from defects, the defects having been shifted deep into the substrate 1 to form a defective area 6, the substrate 2 preserving its crystalline characteristics.

The depth of this defective area 6 in the substrate 1 depends on various factors. This is because the defective area 6 will be shifted to a greater or lesser depth according to the nature and the amorphized state of the materials undergoing the heat treatment, but also according to the amorphized thickness and the recrystallization rate of the material, connected with the annealing rate and therefore with the annealing temperature and duration. Generally speaking, the defects and the interface are forced back several thousand angstroms relative to their initial position, typically 1000 to 3000 Å below the initial interface.

However, these defects do not influence the quality of the interface as they are buried deep in the substrate 1. They can then play the role of traps for contaminating species such as metals.

Several variant embodiments of the invention can be envisioned, in the knowledge that the substrates obtained by direct bonding, such as DSB substrates for example, may be obtained by different layer transfer techniques via hydrophilic or hydrophobic bonding and/or a step of dissolving the insulating layer of $SiO_2$ present within an SOI substrate.

Two variants of the implementation of the invention will be described, by way of illustration, but not limiting: the first brings about an amorphization followed by a recrystallization of a layer including the interface of a DSB substrate obtained by hydrophilic bonding; the second brings about a disorganization followed by a reorganization of a layer including the interface of a substrate obtained by dissolving an oxide layer at the interface.

First Variant: Amorphization-Recrystallization

Figure 2A:
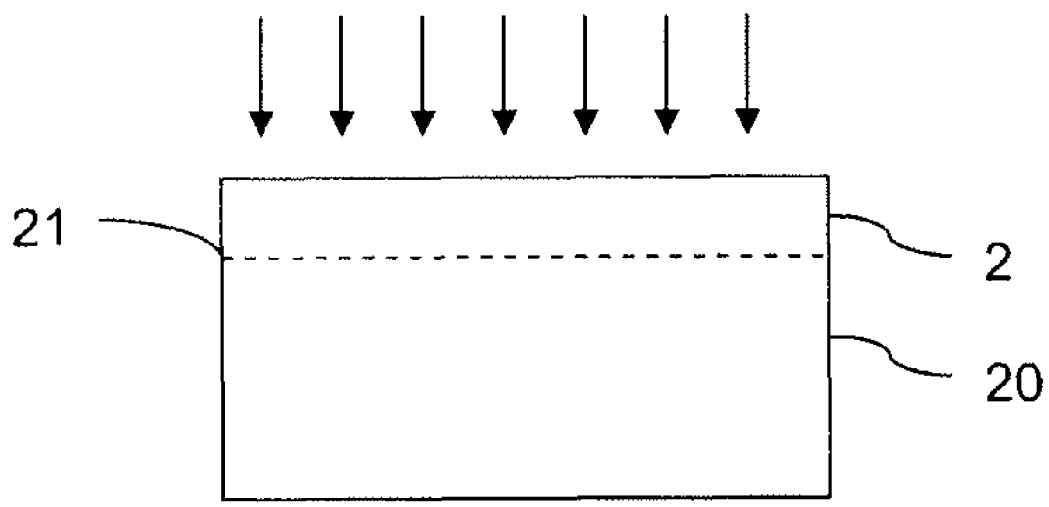
FIGS. 2A to 2B show the main steps of a first variant of forming a substrate by layer transfer.

With reference to FIG. 2A, a substrate called the donor 20, for example made of (110) silicon, undergoes an atomic implantation or co-implantation, schematically represented by the arrows, in order to form an area of embrittlement 21. The area of embrittlement 21 thus defines a thin layer 2.

With a view to bonding the thin layer 2 of the donor substrate 20 to a substrate called the receptor 1, which is for example made of (100) silicon, one and/or the other of these substrates undergoes a surface preparation treatment. Such a treatment may comprise a technique known to a person skilled in the art such as RCA cleaning, brushing, or activation by nitrogen or oxygen plasma.

Figure 2B:
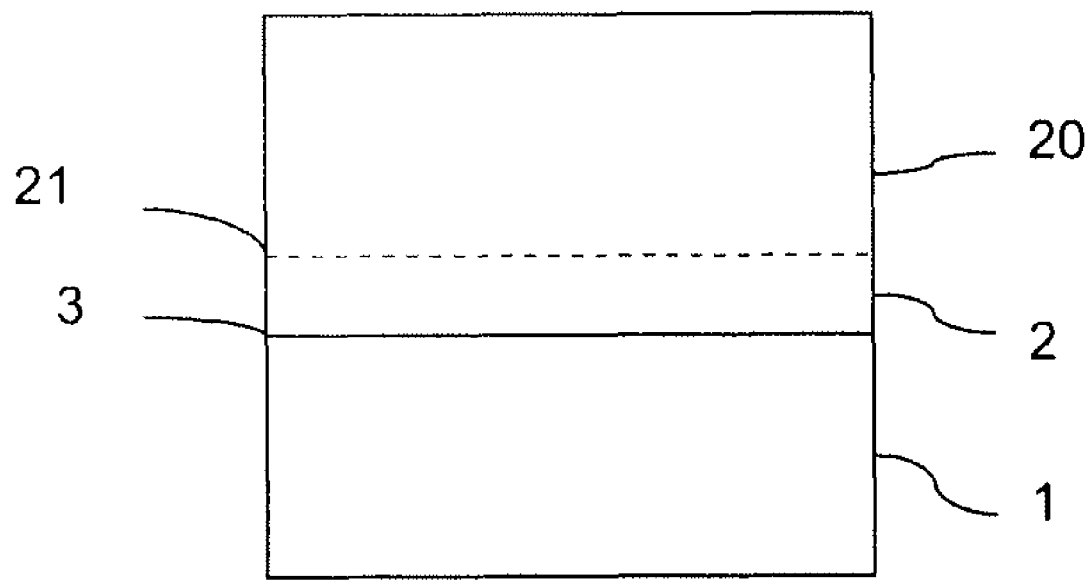

With reference to FIG. 2B, the two substrates are these brought into contact to allow bonding by molecular adhesion.

Afterwards, a heat treatment is applied at a temperature of between 250° C. and 600° C., for a duration ranging from a few minutes for the highest temperatures to a few hours for the lowest temperatures, so as to detach the thin layer 2 of (110) silicon from the donor substrate 20 in order to transfer it to the receptor substrate 1. Mechanical forces may also be used, in a known way, for this transfer, optionally in combination with a heat treatment. Finally, if the donor substrate has not previously undergone an implantation step, the transferred layer may be obtained by grinding and polishing steps (BESOI method).

Finally, annealing is applied to finish and/or strengthen the bonding interface.

With reference to FIG. 1A, the substrate DSB thus obtained comprises oxygen precipitates 4 at the interface 3 between the two substrates.

With reference to FIGS. 1B and 1C the substrate with the atoms of germanium, silicon and/or xenon are implanted in such a way that these disorganize the crystal lattice of the material into which they are implanted. In this way a layer 5 is formed including the interface 3 that is disorganized.

According to a particular embodiment, the implantation is produced with a dose of between $2\times10^{14}$ atoms.cm$^{-2}$ and $5\times10^{15}$ atoms.cm$^{-2}$ and an energy of between 30 and 120 keV. The dose applied depends on the nature of the implanted atom. Thus for silicon atoms the dose must be greater than $2\times10^{15}$ atoms.cm$^{-2}$, for germanium atoms greater than $4\times10^{14}$ atoms.cm$^{-2}$, while for xenon atoms the dose is greater than $2\times10^{14}$ atoms.cm$^{-2}$. In these conditions the disorganization is such that it leads to an amorphization of the layer 5.

The amorphization following the application of a heat treatment has the effect of forcing the crystal defects 4 back deeper into the receptor substrate 1 to form a defective area 6. Generally speaking, the higher the implantation energy applied, the thicker the amorphized region 5 and the more deeply the defects are buried in the receptor substrate 1 after the annealing step. More precisely, the implantation energies are chosen such that the interface 3 situates itself in the amorphized area 5, or even preferably in the middle or toward the upper part of the disturbed area, in order to force back the defects deeper into the receptor substrate 1 to the maximum extent. In the conditions described above, the defects 4 can be forced back to a depth of the order of 1000 to 3000 Å in the receptor substrate 1.

As a general rule, the higher the annealing temperatures, the less time is necessary. Typically the annealing temperature must be greater than 500° C., no matter what the level of disorganization or amorphization is.

According to a variant embodiment, at least one additional amorphization step is successively applied, which allows the defect area 6 to be shifted more and more deeply.

In all cases, thanks to the displacement of this defect area 6, the components which will subsequently be fabricated on the thin layer 2, or the active layer, will perform better due to this burying of defects.

With reference to FIG. 1D, a heat treatment is applied at temperatures of the order of 500° C. to 1000° C. This heat treatment allows recrystallization of the amorphous layer 5, with the thin layer 2 of (110) silicon on the one hand and the receptor substrate 1 of (100) silicon on the other hand serving as seeds for recrystallization.

A high quality interface between materials of different crystalline characteristics is then obtained, the interface defects being forced back with the interface deeper into the substrate and, in the case where a native oxide was present before application of the treatment, the oxygen atoms being spread into a deeper area.

Second Variant: Disorganization-Reorganization

According to this second variant, a DSB substrate is first of all formed by a process comprising the following steps.

Figure 3A:
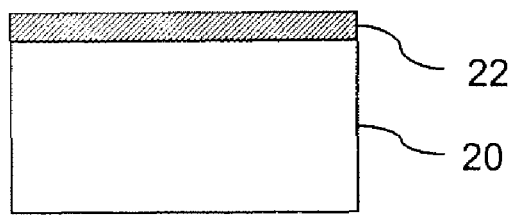
FIGS. 3A to 3D show the main steps of a second variant of forming a substrate by layer transfer.

With reference to FIG. 3A, an optional first step consists in forming an insulating layer 22, preferably made of $SiO_2$ on the surface of a donor substrate 20 made of silicon (110). To this end, a known technique is used, such as oxidation by a wet, or preferably a dry, method, or deposition by CVD ("Chemical Vapor Deposition"), LPCVD ("Low Pressure Chemical Vapor Deposition") or PECVD ("Plasma Enhanced Chemical Vapor Deposition"), or again following oxygen plasma treatment. All these techniques are well known to a person skilled in the art and will therefore not be described in more detail. The insulating layer 22 thus formed has a thickness of less than 200 nm, preferably less than 100 nm, and more particularly between 10 and 50 nm.

According to a variant embodiment, the insulating later described above is not formed, but the native oxide present at the surface of the (110) silicon is preserved, this silicon having a thickness corresponding to a few atomic layers, that is of the order of 0.5 to 1.5 nm.

Figure 3B:
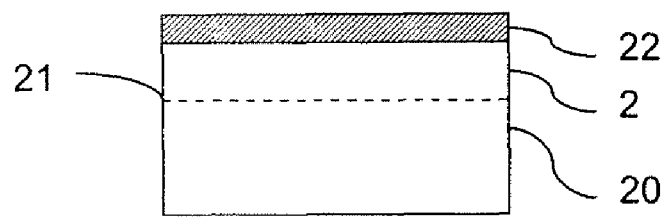

With reference to FIG. 3B, the donor substrate 20 is implanted or co-implanted so as to create an area of embrittlement 21 defining a thin layer 2.

In a following step the surfaces of the donor substrate 20 and of a receptor substrate 1, which is made of (100) silicon, are prepared by known techniques such as cleaning, for example RCA cleaning, brushing, and/or activation by nitrogen or oxygen plasma.

Figure 3C:
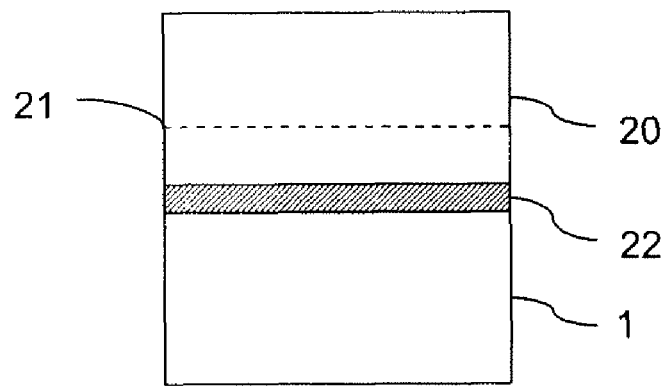

With reference to FIG. 3C, the two substrates are then brought into intimate contact in such a way as to obtain bonding by molecular adhesion (direct water bonding), so that the oxide layer 22 is at the interface between the two substrates.

Figure 3D:
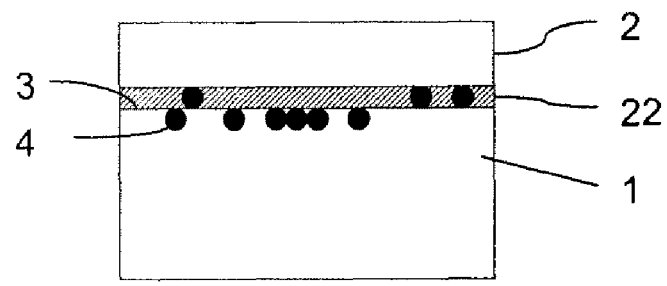

With reference to FIG. 3D, the thin layer 2 of silicon (110) is then detached from the donor substrate 20 to transfer it to the receptor substrate 1 by applying a heat treatment and/or mechanical forces, these methods having already been described for the first variant.

Afterwards, annealing to finish and/or strengthen the bonding interface is applied, then annealing in an inert or reducing atmosphere in order to dissolve the layer of silicon oxide at the interface, in the case where such a layer was present or had previously been formed. In the case where dissolution is necessary, in order that it be complete, it is important that the thin layer 2 transferred has a thickness of between 10 and 500 nm, preferably between 10 and 250 nm, more particularly still between 10 and 120 nm. The thickness of the oxide layer must be between 1 and 100 nm, preferably between 1 and 50 nm. A heat treatment is implemented in such a way that the oxide layer diminishes through to complete disappearance by diffusing the oxygen through the transferred thin layer. Generally speaking, the temperature and the duration of this heat treatment, along with the thicknesses of the transferred layer and of the oxide layer, will be chosen to stimulate the oxygen present in the oxide layer to diffuse through the transferred layer rather than through the receptor substrate. By way of illustrative example, the minimum conditions for annealing in an atmosphere containing argon and/or hydrogen to dissolve a layer of $SiO_2$ of 2 nm thickness below a transferred silicon layer of 100 nm thickness are as follows: 1100° C. for 2 hours, or 1200° C. for 10 minutes, or even 1250° C. for 4 minutes. It should also be noted that the thickness of the transferred layer and the annealing temperature determine the average rate of reduction in the thickness of the oxide layer: the greater the thickness of the transferred layer, the lower the rate; the higher the temperature, the faster the dissolution.

However, with reference to FIGS. 3D and 1A, crystal defects remain, among them oxygen precipitates 4 at the interface 3 between the two substrates, even after dissolution of the oxide layer 22.

To improve the quality of the interface, a treatment according to an embodiment of the invention is applied.

In this embodiment, with reference to FIG. 1B, heavy atoms such as germanium, silicon and/or xenon are implanted in such a way as to disorganize the crystal in a layer 5 including the bonding interface 3. Relative to the first variant, which led to an amorphization of the layer 5, the implantation doses and energies are lower. More precisely, doses of the order of $1 \times 10^{14}$ to $2 \times 10^{15}$ atoms.$cm^{-2}$ and energies of between 30 and 120 keV are chosen. Just as for amorphization, the applied dose depends on the nature of the implanted atom. Thus for silicon atoms, the dose must be greater than $1 \times 10^{15}$ atoms.$cm^{-2}$, for germanium atoms greater than $2 \times 10^{14}$ atoms.$cm^{-2}$, while for xenon atoms the dose is greater than $1 \times 10^{14}$ atoms.$cm^{-2}$.

This disorganization treatment allows the atoms implanted within the crystal to be mixed and the $SiO_2$ bonds of the oxygen precipitates 4, which may remain at the interface 3 despite the dissolution of the oxide layer 22, to be broken.

A reorganization annealing of the layer 5 is then applied in a temperature range of the order of 500 to 1000° C. for 20 minutes to 2 hours, typically 900° C. for 30 minutes.

In the particular case of oxygen precipitate defects, the heat treatment has the effect of spreading the oxygen atoms within the substrates. The other crystal defects are buried more deeply in the receptor substrate 1, as shown by the mark 6 in FIG. 1D.

It is obvious that the embodiments described above are not limiting.

Thus, the invention also applies to DSB substrates obtained by hydrophobic bonding.

The invention is also not limited to silicon substrates of different crystal orientation such as (100) Si and (110) Si, but can in a more general manner be applied to substrates of a different nature, such as of SiC and of Si, or again to substrates of the same nature but of different crystal orientations.

Figure 4A:
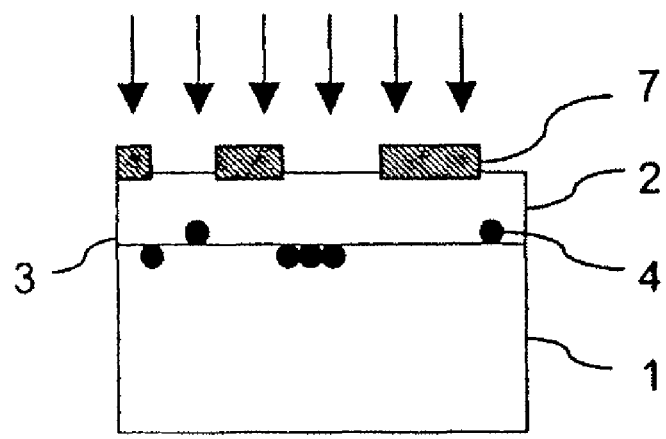
FIGS. 4A to 4C show the main steps of a variant of carrying out the treatment according to the invention.
Figure 4B:
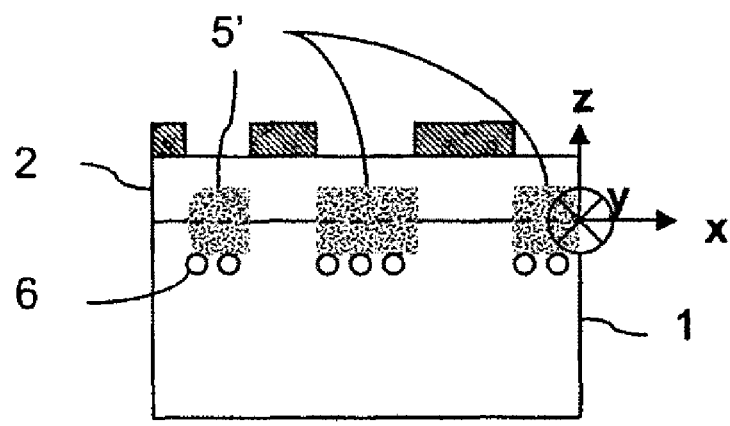

Finally, the invention is not limited to a disorganization or indeed amorphization over the whole surface of the interface, because it can be carried out locally in order to locally displace the interface and the defects joined to it. With reference to an orthogonal reference frame x, y, z associated with the structure and shown in FIG. 4B, the x and y axes defining a horizontal plane corresponding to the plane of the interface 3, the z axis defining a vertical plane, local disorganization is understood to mean the selective disorganization of certain regions of the (x, y) plane.

Figure 4C:
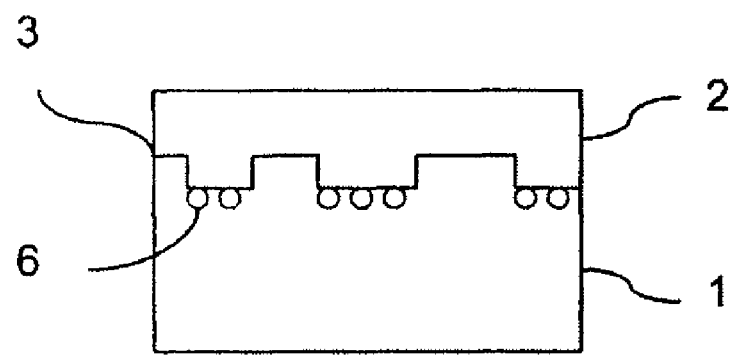

The variants previously disclosed in effect aim to form a continuous disorganized layer 5, that is, one extending over the whole surface of the substrates 1 and 2. It is however possible to create a discontinuous disorganized layer, that is, with reference to FIG. 4C, one exhibiting the form of discrete regions 5' including a part of the interface 3. To this end, with reference to FIG. 4A, a mask 7 is deposited on the surface of the second substrate 2, then an implantation is carried out in the same conditions as those described in the preceding examples. The mask 7 prevents implantation in the regions covered by it. Consequently, the disorganization takes place only in the regions 5' not protected by the mask 7, which thus form a discontinuous disorganized layer, shown in FIG. 4B. This local disorganization therefore has the effect of locally displacing the interface 3 and the defects 6 joined to it. With reference to FIG. 4C, a structure is thus obtained in which the interface 3 between the substrates 1 and 2 is not situated in one and the same plane, but has differences of level in the thickness of the structure.

Figure 5A:
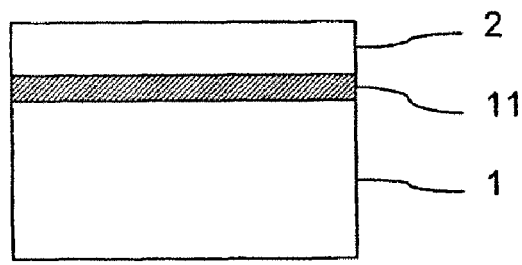
FIGS. 5A to 5D illustrate another example of implementation of the invention.
Figure 5B:
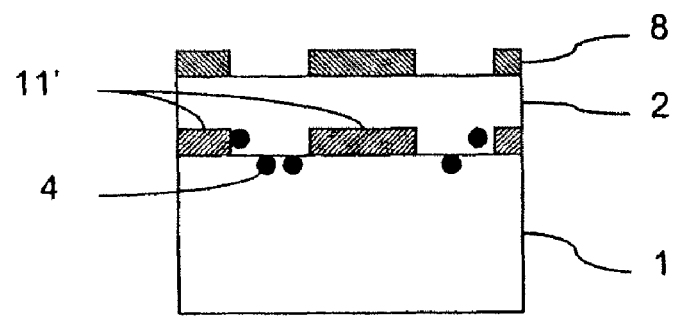
Figure 5C:
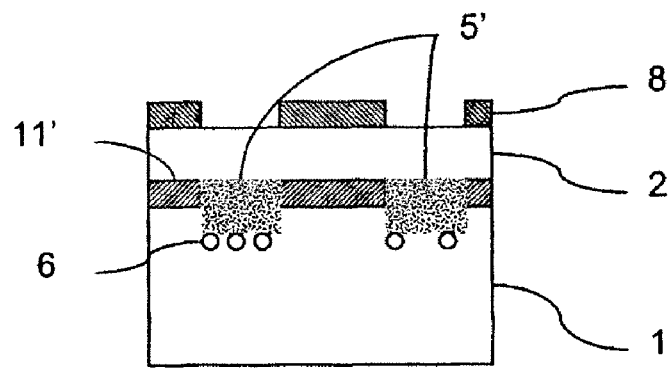
Figure 5D:
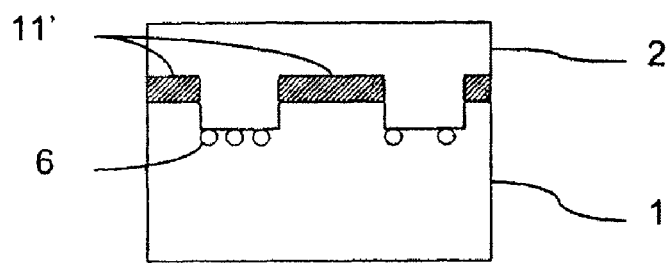

This variant embodiment of the invention applies in particular to structures comprising a discontinuous insulating layer, that is, one which is not present over the whole surface of the substrate, as represented in FIG. 5D. Such a structure may, for example, initially comprise a first substrate 1 on which an insulating layer 11 is formed and a second substrate 2, as shown in FIG. 5A. Typically, if the first substrate 1 is made of Si, the insulating layer 11 is made of $SiO_2$. With reference to FIG. 5B, a discontinuous insulating layer 11' is obtained by selectively dissolving certain regions of the insulating layer through a mask 8, the dissolution conditions having been revealed above. The interface in the regions lacking insulation may then have an insufficient interface quality reflected by the defects 4. To this end, the treatment method according to the invention is particularly advantageously implemented by using the mask 8 used for selective dissolution of the insulating layer 11, the implantation and heat treatment conditions for the disorganization then the reorganization of the crystal lattice being the same as those described in the preceding examples. With reference to FIG. 5D, a structure is therefore obtained including a discontinuous insulating layer in which the defects 6 linked with the interface resulting from the selective dissolution of the insulating layer are forced back deeper into the substrate 1.

What is claimed is:

1. A method of treating a structure produced from semiconductor materials, the structure comprising first and second substrates defining a common interface that includes crystal defects adjacent thereto, wherein the method comprises:
    forming a disorganized layer that includes the common interface and has a crystal lattice at least a part of which is disorganized by implanting atomic species through the second substrate to at least the depth of the common interface, wherein the atomic species are chosen from germanium, argon and xenon and the implantation is carried out with a dosage of between $1\times10^{14}$ and $5\times10^{15}$ atoms/cm$^2$ and an energy of between 30 and 120 keV; and
    reorganizing the crystal lattice of the disorganized layer in order to force the crystal defects back into the first substrate adjacent thereto.

2. The method of claim 1, wherein the first and second substrates are of the same or different semiconductor materials but have different crystal orientations.

3. The method of claim 1, wherein the first substrate is (100) Si or SiC, and the second substrate is made of (110) Si.

4. The method of claim 1, wherein the reorganization is a recrystallization carried out by a heat treatment at a temperature of between 500° C. and 1000° C. for 20 minutes to 2 hours.

5. The method of claim 1, wherein the first and second substrates are connected by molecular bonding.

6. The method of claim 1, wherein the disorganized layer is discontinuous.

7. The method of claim 1, wherein the implantation is effected through a mask.

8. A method of obtaining increased bonding in a semiconductor structure that is fabricated by bonding first and second substrates together at a common interface, which comprises, after bonding, conducting a method of treating according to claim 1 in order to force crystal defects adjacent the common interface back into the first or second substrate adjacent thereto.

9. A method of treating a structure produced from semiconductor materials, the structure comprising first and second substrates defining a common interface that includes crystal defects adjacent thereto, wherein the method comprises:
    forming a disorganized layer that includes the common interface and has a crystal lattice at least a part of which is disorganized; and
    reorganizing the crystal lattice of the disorganized layer in order to force the crystal defects back into the first or second substrate adjacent thereto, wherein the reorganization of the disorganized layer is obtained by applying a heat treatment carried out at a temperature between 500° C. and 1000° C. for 20 minutes to 2 hours.

10. The method of claim 9, wherein the disorganized layer is amorphous and is obtained by implantation with atomic species at a dose of between $2\times10^{14}$ and $5\times10^{15}$ atoms/cm$^2$ and an energy of between 30 and 120 keV in such a way as to shift the crystal defects 1000 to 3000 Å deeper into the first or second substrate.

11. The method of claim 10, wherein the formation of the amorphous layer includes at least one additional implantation step so as to shift the crystal defects even deeper into the first substrate.

12. A method of obtaining increased bonding in a semiconductor structure that is fabricated by bonding first and second substrates together at a common interface, which comprises, after bonding, applying a heat treatment carried out at a temperature between 500° C. and 1000° C. for 20 minutes to 2 hours in order to reduce crystal defects at the common interface and obtain increased bonding between the first and second substrates.

13. The method of claim 12, wherein each substrate comprises crystalline material and which further comprises, before bonding, forming an insulating layer on the first or second substrates, or on both substrates; after bonding and before applying the heat treatment, forming a discontinuous insulating layer by selective dissolution and then applying the heat treatment so as to form disorganized regions in the regions where the insulating layer has been dissolved; such that the crystal defects resulting from the dissolution are forced back deeper into the first or second substrates.

14. The method of claim 13, wherein the discontinuous insulating layer is formed by selectively dissolving the insulating layer using a mask and which further comprises using the same mask for forming the discontinuous disorganized layer.

15. A method of treating a structure produced from semiconductor materials, the structure comprising first and second substrates defining a common interface that includes crystal defects adjacent thereto, wherein the method comprises:
    forming a disorganized layer that includes the common interface and has a crystal lattice at least a part of which is disorganized by implanting atomic species through the second substrate to at least the depth of the common interface;
    reorganizing the crystal lattice of the disorganized layer in order to force the crystal defects back into the first substrate adjacent thereto; and
    shifting the crystal defects even deeper into the first substrate by conducting at least one additional implantation step.

16. The method of claim 15, wherein the disorganized layer is amorphous and is obtained by implantation with atomic species at a dose of between $1\times10^{14}$ and $5\times10^{15}$ atoms/cm$^2$ and an energy of between 30 and 120 keV.

17. A method of obtaining increased bonding in a semiconductor structure that is fabricated by bonding first and second substrates together at a common interface, which comprises, after bonding, conducting a method of treating according to claim 15.

18. The method of claim 17, which further comprises, after bonding, forming a discontinuous insulating layer on the first or second substrate by selective dissolution, and then applying a heat treatment so as to form disorganized regions in the regions where the discontinuous insulating layer was formed, such that the crystal defects resulting from the dissolution are forced back deeper into the first substrate.

* * * * *

UNITED STATES PATENT AND TRADEMARK OFFICE
CERTIFICATE OF CORRECTION

PATENT NO.         : 7,799,651 B2                                           Page 1 of 1
APPLICATION NO.    : 12/165365
DATED              : September 21, 2010
INVENTOR(S)        : Mazure et al.

It is certified that error appears in the above-identified patent and that said Letters Patent is hereby corrected as shown below:

Title Page:
Item (56), References Cited, Other Publications, insert the following reference:
-- Search Report for French Application No. 756370 dated March 27, 2008 --.

Signed and Sealed this
Thirtieth Day of August, 2011

David J. Kappos
*Director of the United States Patent and Trademark Office*